United States Patent [19]
Watanabe et al.

[11] Patent Number: 6,048,779
[45] Date of Patent: Apr. 11, 2000

[54] METHOD OF GROWING SILICON MONOCRYSTAL

[75] Inventors: Masahito Watanabe; Minoru Eguchi, both of Tokyo, Japan

[73] Assignee: NEC Corporation, Tokyo, Japan

[21] Appl. No.: 09/186,284

[22] Filed: Nov. 5, 1998

[30] Foreign Application Priority Data

Nov. 6, 1997 [JP] Japan ................................. 9-304208

[51] Int. Cl.$^7$ ................................................. C30B 15/30
[52] U.S. Cl. .............................. 438/478; 117/13; 423/348
[58] Field of Search ........................... 438/478; 117/13; 423/348

[56] References Cited

U.S. PATENT DOCUMENTS

| | | | |
|---|---|---|---|
| 4,350,557 | 9/1982 | Scholl et al. | 156/601 |
| 5,840,116 | 11/1998 | Kubo | 117/20 |
| 5,925,185 | 6/1999 | Kawashima et al. | 117/13 |

FOREIGN PATENT DOCUMENTS

| | | |
|---|---|---|
| 62-83348 | 4/1987 | Japan . |
| 1-282185 | 11/1989 | Japan . |
| 8-231294 | 9/1996 | Japan . |
| 8-333191 | 12/1996 | Japan . |

OTHER PUBLICATIONS

H. Hirata et al., "Silicon Crystal Growth in a Cusp Magnetic Field", Journal of Crystal Growth, vol. 96, (1989), pp. 747–755.
H. Hirata et al., Homogeneous Increase in Oxygen Concentration in Czochralski Silicon Crystals by a Cusp Magnetic Field, vol. 98, (1989), pp. 777–781.

*Primary Examiner*—Charles Bowers
*Assistant Examiner*—Granvill Lee
*Attorney, Agent, or Firm*—Sughrue, Mion, Zinn, Macpeak & Seas, PLLC

[57] ABSTRACT

There is provided a method of growing silicon monocrystal by Czochralski method where cusp field is applied to molten silicon, including the step of applying cusp field to molten silicon so that a center of the cusp field is situated at a depth of one-third or greater of an entire depth of the molten silicon, the depth being defined as a distance from a surface level of the molten silicon. The method makes it possible to eliminate growth slits in all regions in a growth direction of grown silicon monocrystal, and in addition, to accomplish uniform oxygen concentration profile where a difference in an oxygen concentration in a direction of a diameter of crystal is equal to or smaller than 5%. Furthermore, the method makes it possible to eliminate growth slits in all regions in a growth direction in a large-diameter silicon monocrystal, for instance, having a 40 cm-diameter.

8 Claims, 12 Drawing Sheets

METHOD OF GROWING SILICON MONOCRYSTAL

BACKGROUND OF THE INVENTION

1. Field of the Invention

The invenetion relates to a method of growing silicon monocrystal by Czochralski method, and more particularly to a method of growing silicon monocrystal by applying cusp field to molten silicon.

2. Description of the Related Art

A conventional method of growing silicon monocrystal by Czochralski method has a problem that when a silicon monocrystal wafer used for a substrate on which a ultra-micro, and ultra-highly integrated device is formed is to be grown, if a wafer has an ununiform oxygen concentration profile, the wafer would be heavily curved in heat treatment.

Another problem is that if a wafer has fluctuation in a quite small concentration of oxygen, there would be generated unevenness in oxygen precipitation during device fabrication steps, which in turn causes reduction in a fabrication yield of devices.

The above-mentioned fluctuation in a small concentration of oxygen forms a pattern in crystal. This pattern is called a growth slit, and can be observed, for instance, by An X-ray topograph.

The growth slit is caused by small fluctuation in temperature at an interface between solid and liquid phases in growing crystal. The growth slit has a shape reflecting a shape of an interface between solid and liquid phases, in a direction in which molten silicon is drawn up, and has a shape of concentric circles in a plane of crystal.

An oxygen concentration varies in dependence on a profile of the growth slit. Oxygen contained in a silicon monocrystal wafer is unpreferably mixed into silicon crystal due to melting of a quartz crucible which contains molten silicon therein while silicon monocrystal is grown.

Accordingly, it is quite important in silicon monocrystal growth to ensure uniformity in oxygen concentration profile in crystal, and to suppress fluctuation in a small concentration of oxygen, namely, to prevent generation of growth slits.

To this end, Japanese Unexamined Patent Publications Nos. 62-83348 and 1-282185 have suggested a method of growing silicon monocrystal by Czochralski method. In the suggested method, cusp field is applied to molten silicon, and a revolution per minute of a crucible and molten silicon contained in the crucible is set at a particular revolution, to thereby uniformize an oxygen concentration profile in silicon monocrystal.

The principle of this method is described in Journal of Crystal Growth, Vol. 96, 1989, pp. 747 and Vol. 98, 1989, pp. 777.

Japanese Unexamined Patent Publication No. 8-231294 has suggested an apparatus for growing silicon monocrystal by Czochralski method. FIG. 1 illustrates the suggested apparatus.

A quartz crucible 104 contains molten silicon 101 therein. The quartz crucible 104 is fixed at a lower surface thereof to a shaft 105 which moves the crucible 104 upwardly and downwardly. A pair of ultra-conductive coil magnets 103 is located around the quartz crucible 104. A central line 102 of magnetic flux generated by the coil magnets 103 horizontally extends. A vertical gap "h" between a surface of the molten silicon 101 and the central line 102 of horizontal flux is kept equal to or smaller than 5 cm while silicon monocrystal is being grown.

Japanese Unexamined Patent Publication No. 8-333191 has suggested an apparatus for growing silicon monocrystal by Czochralski method. FIG. 2 illustrates the suggested apparatus.

In FIG. 2, a crucible 125 contains molten silicon 121 therein, and is connected at a lower surface thereof with a support shaft 122. A pair of ultra-conductive electromagnets 124a and 124b are situated around the crucible 125. The electromagnets 124a and 124b have a common horizontal center line 123. The support shaft 122 is designed to be vertically movable, and raises or lowers the crucible 125 so that the center line 123 of the electromagnets 124a and 124b passes through or below a center of a depth of the molten silicon 121. An equi-intensive curve E has a distribution as illustrated in FIG. 2.

In the above-mentioned apparatuses for growing silicon monocrystal by Czochralski method, a revolution per minute at which a crucible and molten silicon are rotated is defined in accordance with conditions for crystal growth. Hence, if conditions for crystal growth were to be changed, it would be necessary to change the revolution per minute accordingly.

For growing silicon monocrystal having a diameter of 30 cm or greater, it would be necessary to support a crucible containing molten silicon having a great weight, and further necessary to rotate the crucible at a high speed. This causes the apparatus to become large-sized.

For these reasons, it was quite difficult for the conventional apparatuses for growing silicon monocrystal by Czochralski to uniformize oxygen concentration, and prevent fluctuation in quite small concentration of oxygen to thereby draw up crystal having no growth slits therein.

Thus, in accordance with the above-mentioned conventional methods of growing silicon monocrystal by Czochralski, it is necessary to arrange a revolution of a crucible and molten silicon to be greater than a revolution per minute to be determined in accordance with growth conditions, in order to concurrently accomplish both uniform profile of an oxygen concentration in grown silicon monocrystal and prevention of fluctuation in quite small oxygen concentration, that is, prevention of generation of growth slits. As a result, it is quite difficult or almost impossible to grow silicon monocrystal having a diameter of 30 cm or greater.

SUMMARY OF THE INVENTION

In view of the above-mentioned problems of the conventional apparatuses for growing silicon monocrystal by Czochralski method, it is an object of the present invention to provide a method of growing silicon monocrystal by Czochralski method, which is capable of uniformizing an oxygen concentration profile in silicon monocrystal, and suppressing fluctuation in small concentration of oxygen, to thereby prevent generation of growth slits, without defining a revolution per minute of a crucible and molten silicon.

It is also an object of the present invention to provide a method of growing silicon monocrystal by Czochralski method, which is capable of readily providing highly qualified silicon monocrystal, even if silicon monocrystal to be grown has a large diameter such as 30 cm or greater.

Another object of the present invention is to provide an apparatus for growing silicon monocrystal by Czochralski method, which apparatus has the same characteristics of the above-mentioned method.

In one aspect of the present invention, there is provided a method of growing silicon monocrystal by Czochralski method where cusp field is applied to molten silicon, including the step of applying cusp field to molten silicon so that a center of the cusp field is situated at a depth of one-third or greater of an entire depth of the molten silicon, the depth being defined as a distance from a surface level of the molten silicon.

It is preferable that the method further includes the step of drawing the molten silicon up so that a ratio between the entire depth of the molten silicon and the depth of the center of the cusp field is kept constant.

The above-mentioned step of drawing the molten silicon up may include the steps of (a) detecting a surface level of the molten silicon, and (b) keeping the ratio constant during growth of the silicon monocrystal. For instance, the surface level of the molten silicon may be detected by An X-ray fluoroscopy in the step (a).

It is preferable that a crucible in which the molten silicon is contained is vertically moved to thereby keep the ratio constant in the step (b). As an alternative, the center of the cusp field may be vertically moved to thereby keep the ratio constant in the step (b).

In another aspect of the present invention, there is provided an apparatus for growing silicon monocrystal by Czochralski method where cusp field is applied to molten silicon, including (a) a crucible in which molten silicon is contained, (b) a magnetic field generator for applying cusp field to the molten silicon, (c) an elevator for lowering or raising at least one of the crucible and the magnetic field generator, (d) a detector for detecting a surface level of the molten silicon, and transmitting a signal indicative of the thus detected surface level, and (e) a controller for controlling at least one of the elevator and the magnetic field generator in accordance with the signal transmitted from the detector so that a center of the cusp field is situated at a depth of one-third or greater of an entire depth of the molten silicon, the depth being defined as a distance from the surface level of the molten silicon.

It is preferable that the controller controls the elevator so that a ratio between the entire depth of the molten silicon and the depth of the center of the cusp field is kept constant. For instance, the detector may be comprised of An X-ray fluoroscopic device.

In accordance with the present invention, a center of cusp field is kept located below a surface of molten silicon while silicon monocrystal is being grown. The center of cusp field is kept situated at a depth of one-third or greater of an entire depth of the molten silicon. Herein, a depth is defined as a distance between the center of cusp field and a surface of the molten silicon contained in a quartz crucible.

By applying cusp field to the molten silicon in the above-mentioned manner, a temperature profile in planes in the molten silicon is rendered symmetrical about a rotation axis of a crucible, and there is almost no fluctuation in a temperature in a region located just below an interface between solid and liquid phases.

In addition, the arrangement of cusp field in the above-mentioned manner forms well symmetrical temperature field, which ensures axisymmetric, slow flow of molten silicon. As a result, there is generated no fluctuation in a small concentration of oxygen, which ensures no generation of growth slits.

Furthermore, since a center of cusp field is arranged to be located within molten silicon, magnetic field components perpendicular to each other are applied to a sidewall and a bottom of a crucible. Hence, it would be possible to uniformize a concentration of oxygen dissolved into molten silicon from a quartz crucible, which in turn makes it possible to uniformize a distribution of oxygen concentration in silicon monocrystal without necessity of setting a revolution per minute of molten silicon and a crucible to be a particular revolution per minute.

The above-mentioned advantages are obtained as a result of the various experiments the inventors conducted with respect to flow, temperature profile, and growth conditions of molten silicon to which cusp field is applied, and are not anticipated by the conventional apparatuses and mechanism about how molten silicon is influenced by cusp field, reported in various books.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
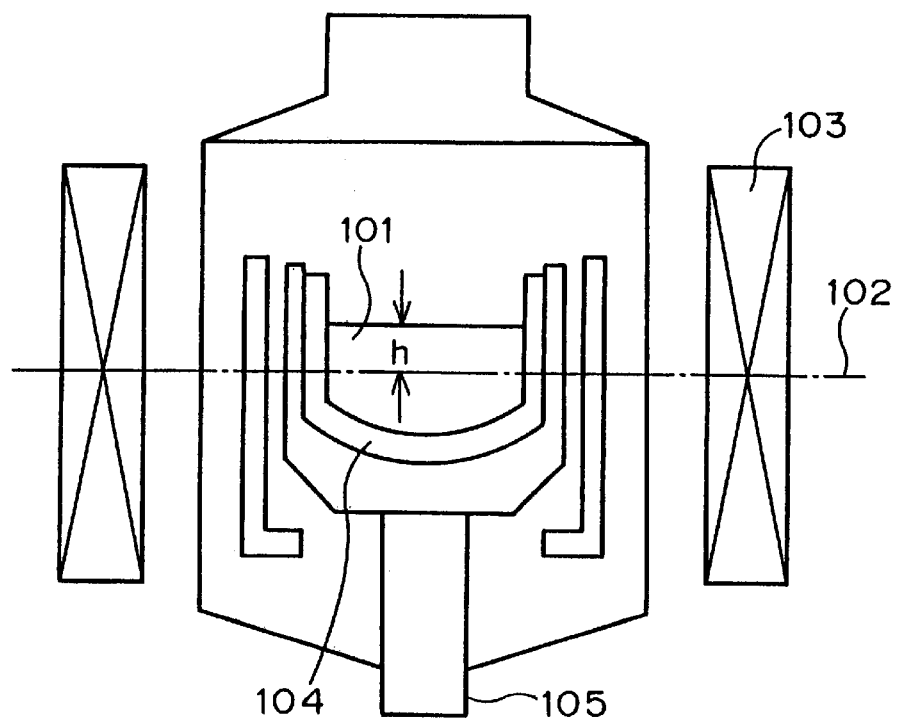
FIG. 1 is a cross-sectional view of a conventional apparatus for growing silicon monocrystal by Czochralski method.
Figure 2:
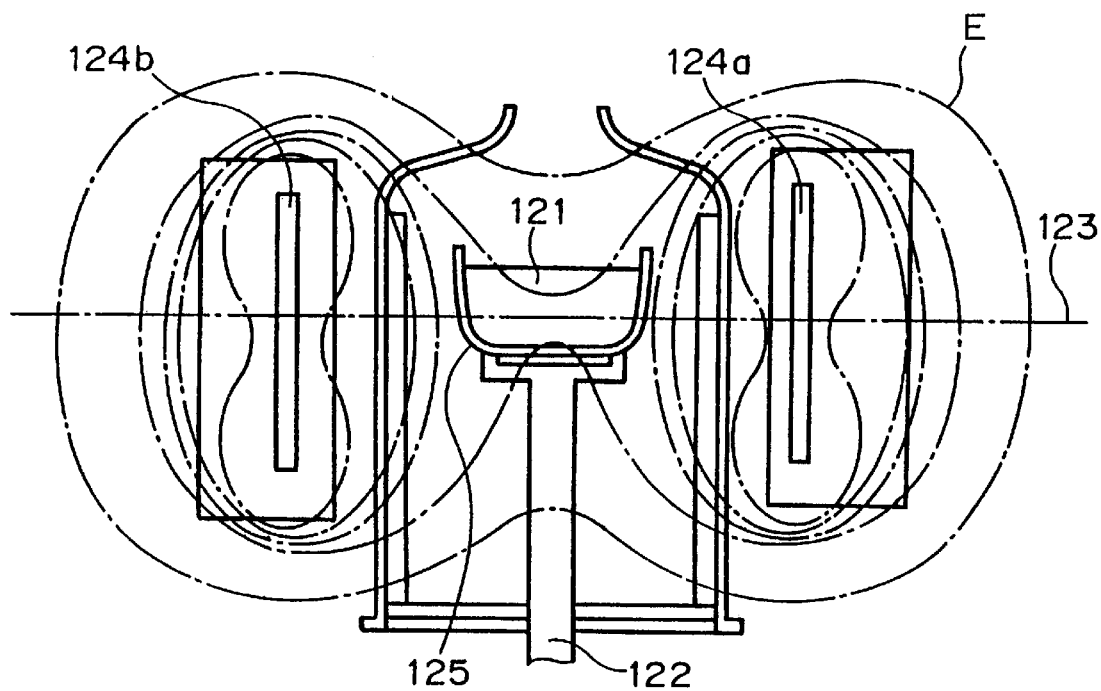
FIG. 2 is a cross-sectional view of another conventional apparatus for growing silicon monocrystal by Czochralski method.
Figure 3A:
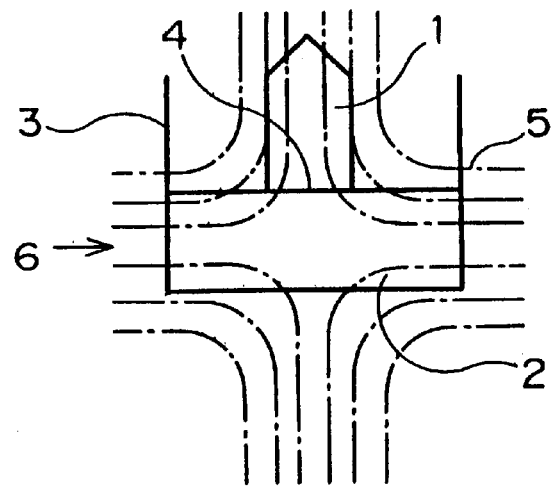
FIGS. 3A to 3C are cross-sectional views of a crucible and molten silicon contained therein, each illustrating a positional relation between a center of cusp field and a surface of molten silicon.
Figure 3B:
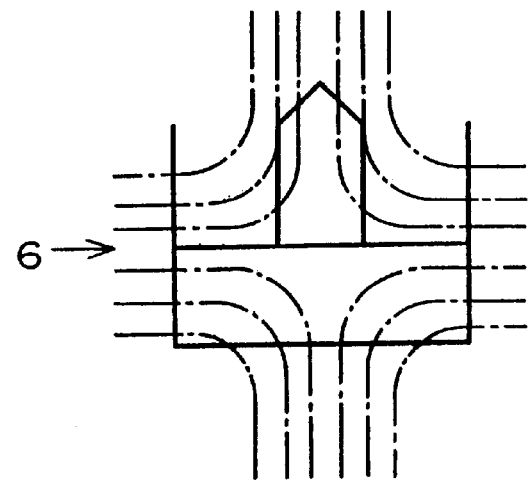
Figure 3C:
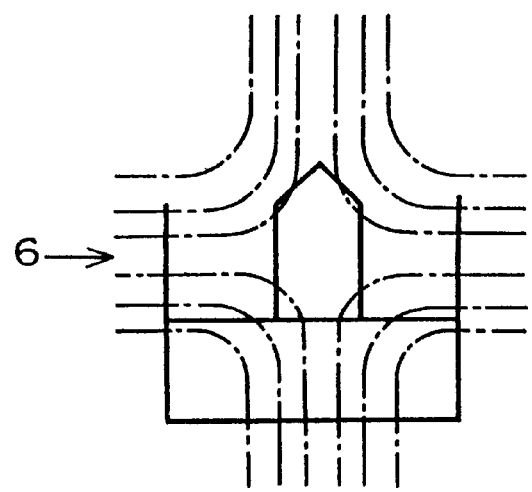

FIGS. 3A to 3C illustrate positional relations between a center of cusp field and a surface of molten silicon. A quartz crucible 3 contains molten silicon 2 therein. Silicon monocrystal 1 is drawn up from the molten silicon 2 through an interfacial surface between solid and liquid phases. Cusp field having magnetic field distribution 5 is applied to the molten silicon 2.

FIG. 3A illustrates that a center 6 of cusp field is located below a surface of the molten silicon 2, FIG. 3B illustrates that the center 6 of cusp field is located at a surface of the molten silicon 2, and FIG. 3C illustrates that the center 6 of cusp field is located above a surface of the molten silicon 2.

In the present invention, the center 6 of cusp field is arranged to be located below a surface of the molten silicon 2, as illustrated in FIG. 3A, and specifically, located at one-third or greater of an entire depth of the molten silicon 2.

Figure 4:
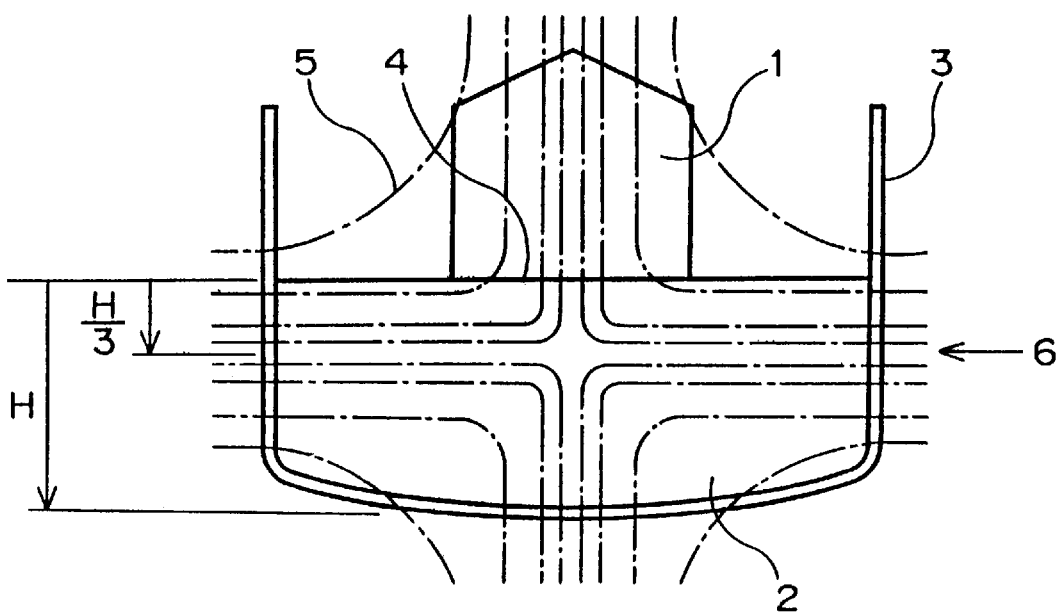
FIG. 4 is a cross-sectional view of a crucible and molten silicon contained therein, illustrating a positional relation between a center of cusp field and a surface of molten silicon in a method in accordance with a preferred embodiment of the present invention.
Figure 5A:
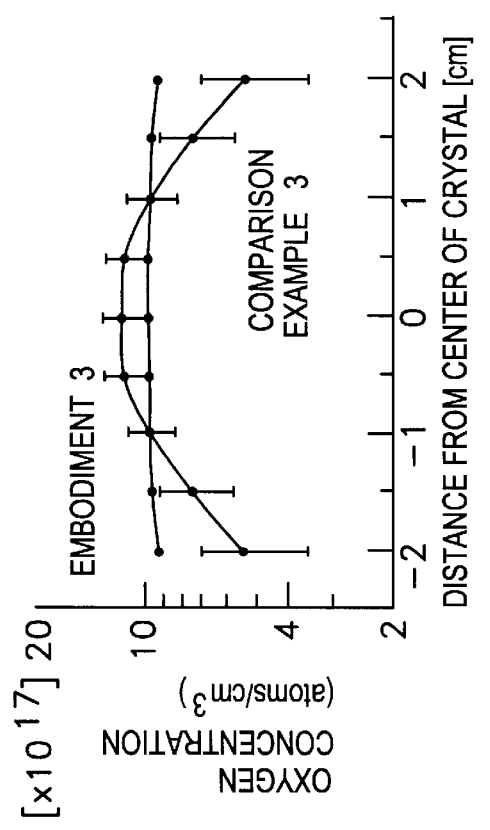
FIGS. 5A to 5D are graphs illustrating results of carrying out methods in accordance with both the embodiments 1 to 4 and comparison examples 1 to 4.
Figure 5C:
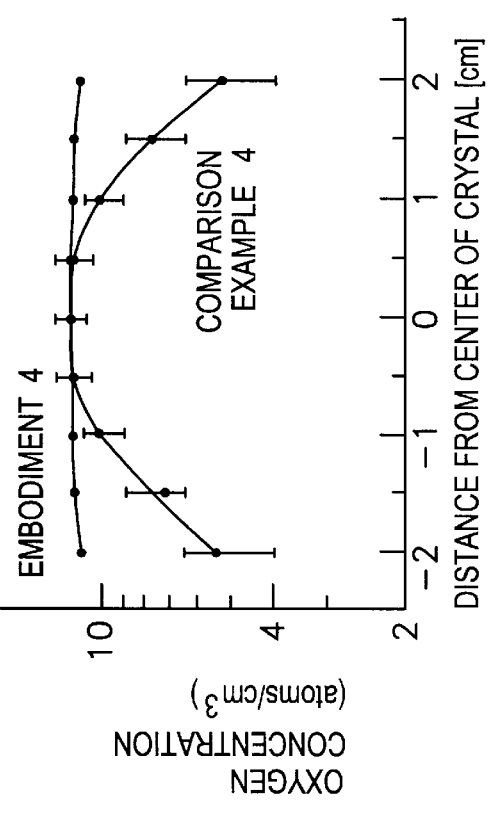
Figure 5B:
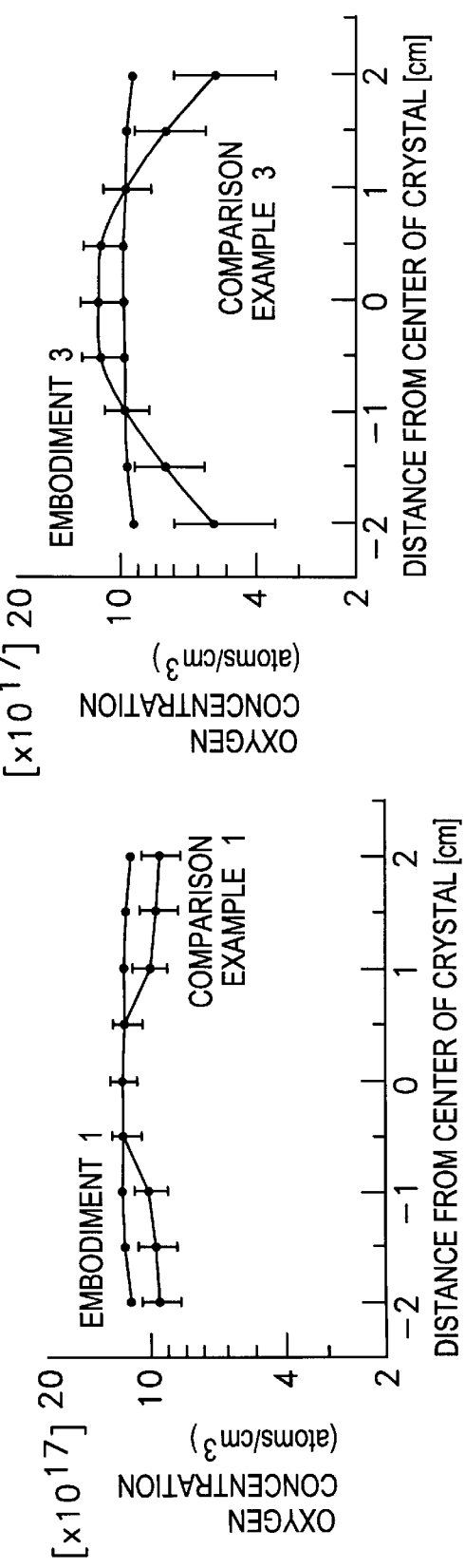
Figure 5D:
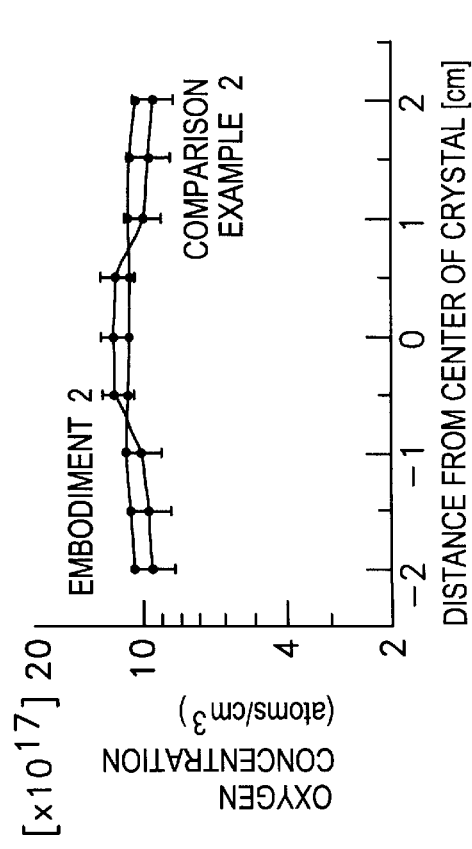

FIG. 4 illustrates a positional relation between the center 6 of cusp field and a surface of the molten silicon 2 in the present embodiment. As illustrated, the center 6 is arranged to be located below a surface of the molten silicon 6, and specifically, located at one-third of an entire depth H of the molten silicon 2. Herein, the entire depth H is defined as a distance from the interface 4 between solid and liquid phases to a bottom of the quartz crucible 3.

Hereinbelow, embodiments 1 to 11 are explained with reference to FIGS. 5A to 12 and Tables 1 to 4.

Table 1 shows conditions for growing silicon monocrystal in the embodiments 1 to 4.

TABLE 1

| | A | B | C | D | E | F | G | H |
|---|---|---|---|---|---|---|---|---|
| Embodiment 1 | 500 | 500 | 0 to 20 | −0.1 to −10 | 4.0 | 1.33 | 1.5, 2.0, 2.5, 3.0, 3.5 | Yes |
| Embodiment 2 | 1000 | 1000 | 0 to 20 | −0.1 to −10 | 4.0 | 1.33 | 1.5, 2.0, 2.5, 3.0, 3.5 | Yes |
| Embodiment 3 | 1500 | 1500 | 0 to 20 | −0.1 to −10 | 4.0 | 1.33 | 1.5, 2.0, 2.5, 3.0, 3.5 | Yes |
| Embodiment 4 | 2000 | 2000 | 0 to 20 | −0.1 to −10 | 4.0 | 1.33 | 1.5, 2.0, 2.5, 3.0, 3.5 | Yes |

In Table 1, A to H mean as follows.
A: an intensity of magnetic field at a bottom of a crucible [gauss]
B: an intensity of magnetic field at a sidewall of a crucible [gauss]
C: revolution per minute of silicon monocrystal [rpm]
D: revolution per minute of a crucible [gauss]
E: an entire depth of molten silicon H [cm]
F: H/3 [cm]
G: a depth of a center of cusp field from a surface of molten silicon at the time when silicon monocrystal starts being grown [cm]
H: whether a location at which cusp field is applied to is controlled As shown in Table 1, an intensity of magnetic field applied perpendicularly to a bottom of a crucible, and an intensity of magnetic field applied perpendicularly to a sidewall of a crucible were measured to thereby measure an intensity of magnetic field having been applied to molten silicon.

In the embodiments 1 to 4, silicon monocrystal having a diameter of 35 mm was introduced into a quartz crucible, and there was obtained molten silicon having an entire depth of 4.0 cm.

The cusp field was applied to the molten silicon at a depth of 1.5 cm, 2.0 cm, 2.5 cm, 3.0 cm, and 3.5 cm from a surface of the molten silicon.

The crucible was rotated at a revolution per minute in the range of 0.1 to 10 in a clockwise direction, and crystal was rotated at a revolution per minute in the range of 0 to 200 in a counterclockwise direction.

In order to confirm the advantageous effects obtained by the invention, the experiments were also conducted under conditions shown in Table 2 as comparison examples 1 to 4. In the comparison examples 1 to 4, cusp field was applied to molten silicon at a depth smaller than one-third of an entire depth of the molten silicon. The conditions for carrying out the comparison examples 1 to 4 were the same as the conditions for carrying out the embodiments 1 to 4 except a depth at which cusp field was applied to molten silicon.

The conditions for growing silicon monocrystal in the comparison examples 1 to 4 are shown in Table 2.

TABLE 2

| | A | B | C | D | E | F | G | H |
|---|---|---|---|---|---|---|---|---|
| Comparsion Example 1 | 500 | 500 | 0 to 20 | −0.1 to −10 | 4.0 | 1.33 | 1.0, 0.0, −1.0, −2.0, −2.5, −3.0, −4.0, −5.0 | Yes |
| Comparison Example 2 | 1000 | 1000 | 0 to 20 | 31 0.1 to −10 | 4.0 | 1.33 | 1.0, 0.0, −1.0, −2.0, −2.5, −3.0, −4.0, −5.0 | 0.0, Yes |
| Comparison Example 3 | 1500 | 1500 | 0 to 20 | −0.1 to −10 | 4.0 | 1.33 | 1.0, 0.0, −1.0, −2.0, −2.5, −3.0, −4.0, −5.0, | Yes |
| Comparison Example 4 | 2000 | 2000 | 0 to 20 | −0.1 to −10 | 4.0 | 1.33 | 1.0, 0.0, −1.0, −2.0, −2.5, −3.0, −3.5, −4.0, −5.0 | Yes |

In Table 2, A to H mean as follows.
A: an intensity of magnetic field at a bottom of a crucible [gauss]
B: an intensity of magnetic field at a sidewall of a crucible [gauss]
C: revolution per minute of silicon monocrystal [rpm]
D: revolution per minute of a crucible [gauss]
E: an entire depth of molten silicon H [cm]
F: H/3 [cm]
G: a depth of a center of cusp field from a surface of molten silicon at the time when silicon monocrystal starts being grown [cm]. A minus sign (−) indicates that a center of cusp field is applied above a surface of molten silicon.

H: whether a location at which cusp field is applied to is controlled

In comparison examples 5 to 8, silicon monocrystal was grown in the same cusp field intensity as that of the above-mentioned embodiments 1 to 4, but without keeping constant a positional relation between a center of cusp field and a surface of molten silicon while silicon monocrystal was being grown.

Both a center of cusp field and revolution per minute of a crucible at the start of silicon monocrystal growth were kept under the constant conditions as shown in Table 3 in any of the comparison examples 5 to 8, while silicon monocrystal was being grown.

The silicon monocrystal grown under such conditions as shown in Table 3 was sliced into pieces in parallel in a direction of growth axis. Then, growth slits were observed by An X-ray topograph. A concentration of oxygen in the sliced pieces in a diametric direction was measured by FT-IR process to thereby determine the oxygen concentration distribution.

The conditions for growing silicon monocrystal in the comparison examples 5 to 8 were shown in Table 3.

TABLE 3

| | A | B | C | D | E | F | G | H |
|---|---|---|---|---|---|---|---|---|
| Comparison Example 5 | 500 | 500 | 15 | 5 | 4.0 | 1.33 | 2.0, 0.0, −2.0 | No |
| Comparison Example 6 | 1000 | 1000 | 15 | 5 | 4.0 | 1.33 | 2.0, 0.0, −2.0 | No |
| Comparison Example 7 | 1500 | 1500 | 15 | 5 | 4.0 | 1.33 | 2.0, 0.0, −2.0 | No |
| Comparison Example 8 | 2000 | 2000 | 15 | −5 | 4.0 | 1.33 | 2.0, 0.0, −2.0 | No |

In Table 3, A to H mean as follows.

A: an intensity of magnetic field at a bottom of a crucible [gauss]

B: an intensity of magnetic field at a sidewall of a crucible [gauss]

C: revolution per minute of silicon monocrystal [rpm]

D: revolution per minute of a crucible [gauss]

E: an entire depth of molten silicon H [cm]

F: H/3 [cm]

G: a depth of a center of cusp field from a surface of molten silicon at the time when silicon monocrystal starts being grown [cm]. A minus sign (−) indicates that a center of cusp field is applied above a surface of molten silicon.

H: whether a location at which cusp field is applied to is controlled

The conditions for growing silicon monocrystal in the comparison examples 5 to 8, other than the conditions shown in Table 3, were shown in Table 4.

TABLE 4

| | | Growth Slits | | | I | | |
|---|---|---|---|---|---|---|---|
| | G | J | K | L | J | K | L |
| Comparison Example 5 | −2.0 | ○ | ○ | ○ | 25 | 23 | 25 |
| | 0.0 | ○ | ○ | ○ | 23 | 20 | 22 |
| | 2.0 | x | ○ | ○ | 5 | 10 | 15 |
| Comparison Example 6 | −2.0 | ○ | ○ | ○ | 25 | 23 | 25 |
| | 0.0 | ○ | ○ | ○ | 23 | 20 | 22 |
| | 2.0 | x | ○ | ○ | 5 | 10 | 15 |
| Comparison Example 7 | −2.0 | ○ | ○ | ○ | 25 | 23 | 25 |

TABLE 4-continued

| | | Growth Slits | | | I | | |
|---|---|---|---|---|---|---|---|
| | G | J | K | L | J | K | L |
| Example 7 | 0.0 | ○ | ○ | ○ | 23 | 20 | 22 |
| | 2.0 | x | ○○ | 5 | 10 | 15 | |
| Comparison Example 8 | −2.0 | ○ | ○ | ○ | 25 | 23 | 25 |
| Example 8 | 0.0 | ○ | ○ | ○ | 23 | 20 | 22 |
| | 2.0 | x | ○ | ○ | 5 | 10 | 15 |

In Table 4, G, I to L, ○ and x indicate as follows.

G: a depth of a center of cusp field from a surface of molten silicon at the time when silicon monocrystal starts being grown [cm]. A minus sign (−) indicates that a center of cusp field is applied above a surface of molten silicon.

I: oxygen concentration distribution [%]

J: solidification rate of 20%

K: solidification rate of 50%

L: solidification rate of 70%

○: growth slits were found.

x: growth slits were not found.

Table 4 show the results of measuring growth slits and oxygen concentration distribution in silicon monocrystal which has been grown without controlling a positional relation between a center of cusp field and a surface of molten silicon in the comparison examples 5 to 8.

FIGS. 5A to 5D are graphs showing comparison the results of the embodiments 1 to 4 to the results of the comparison examples 1 to 4. The results shown in FIGS. 5A to 5D were measured at solidification rates of 20%, 50%, and 70%. The averaged measurement results are indicated by solid circles at each location, and fluctuation in the measurement results at each location is shown by an error bar.

Figure 6:
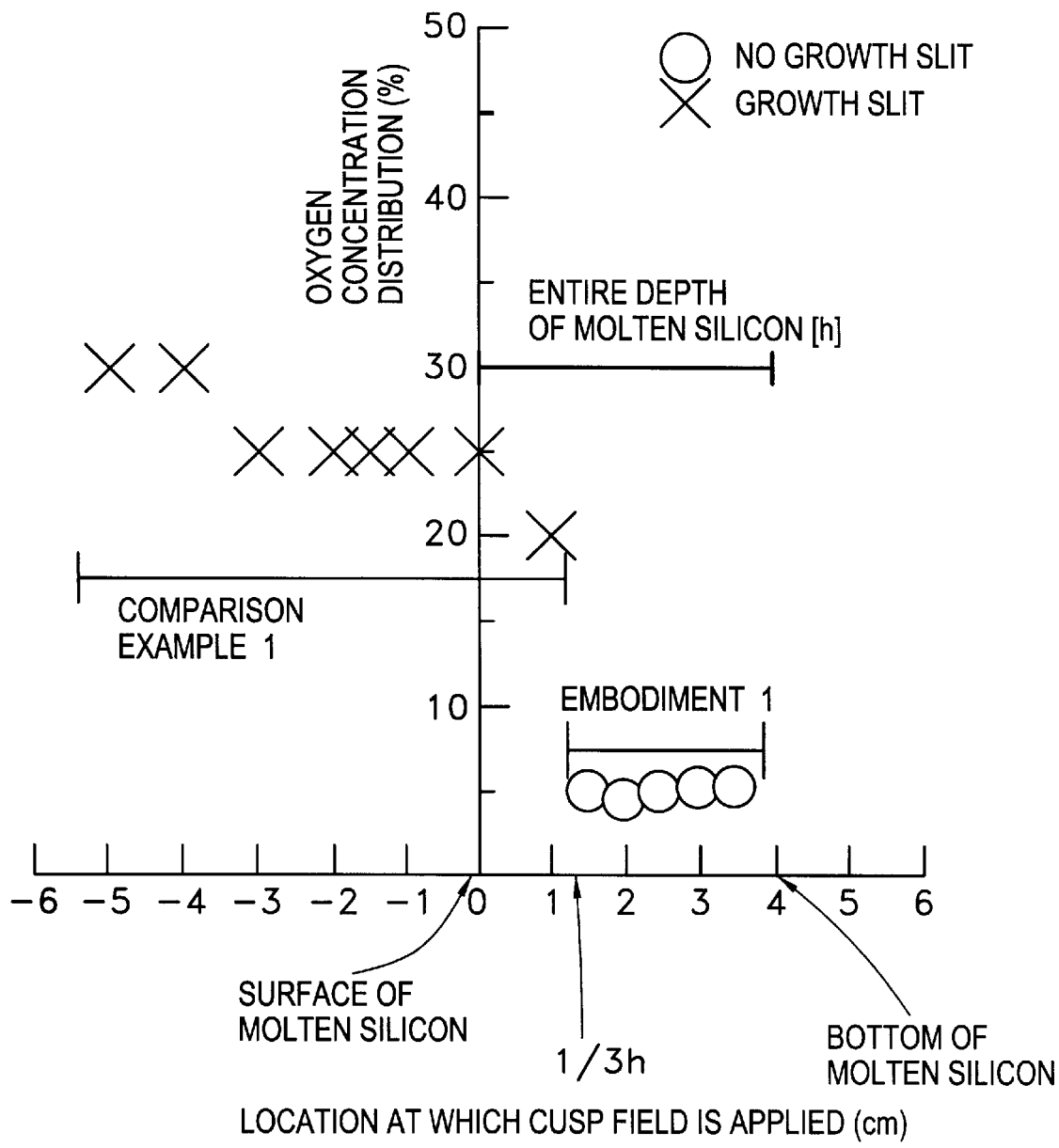
FIG. 6 is a graph illustrating results of carrying out methods in accordance with the embodiment 1 and comparison example 1.
Figure 7:
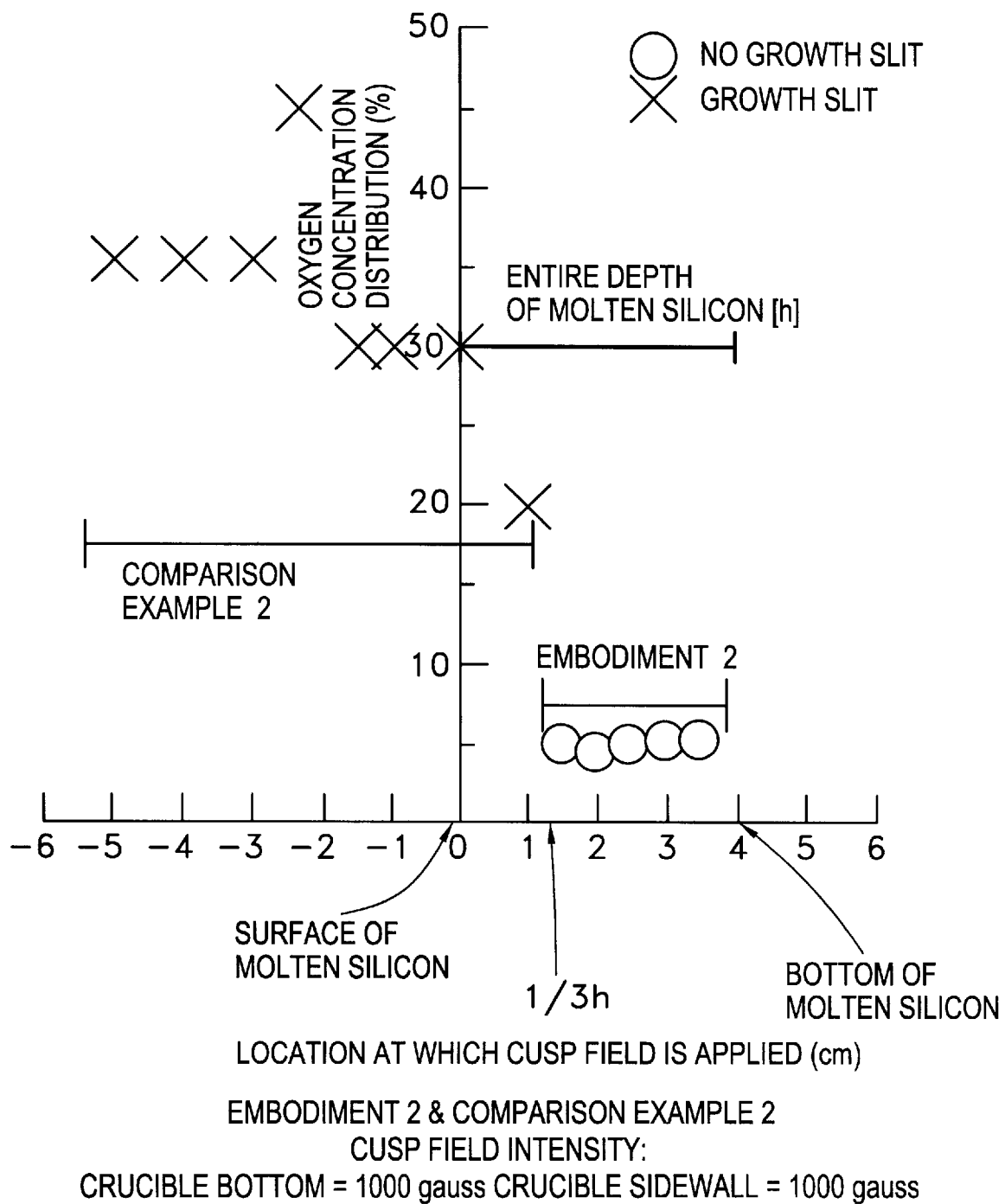
FIG. 7 is a graph illustrating results of carrying out methods in accordance with the embodiment 2 and comparison example 2.
Figure 8:
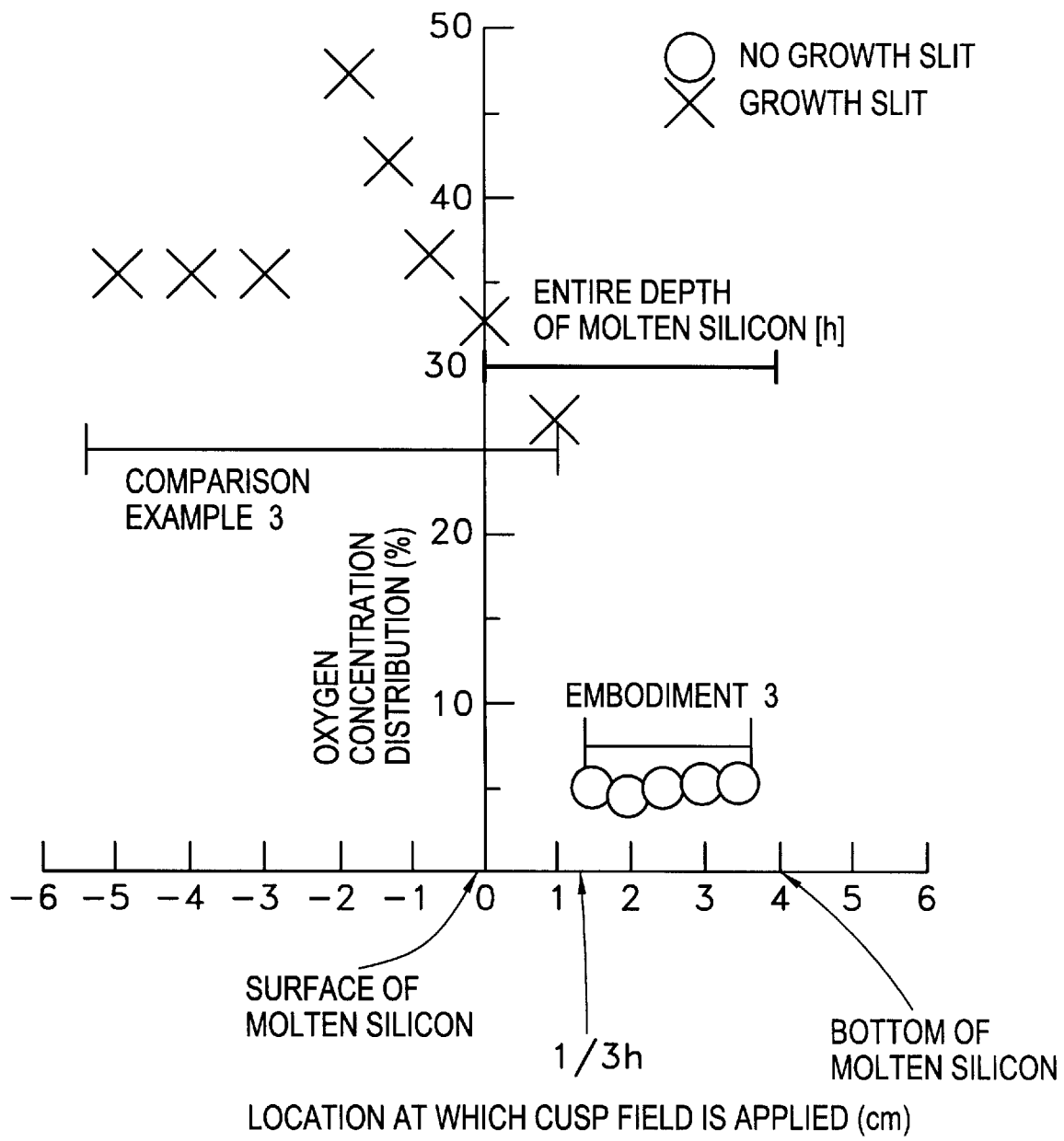
FIG. 8 is a graph illustrating results of carrying out methods in accordance with the embodiment 3 and comparison example 3.
Figure 9:
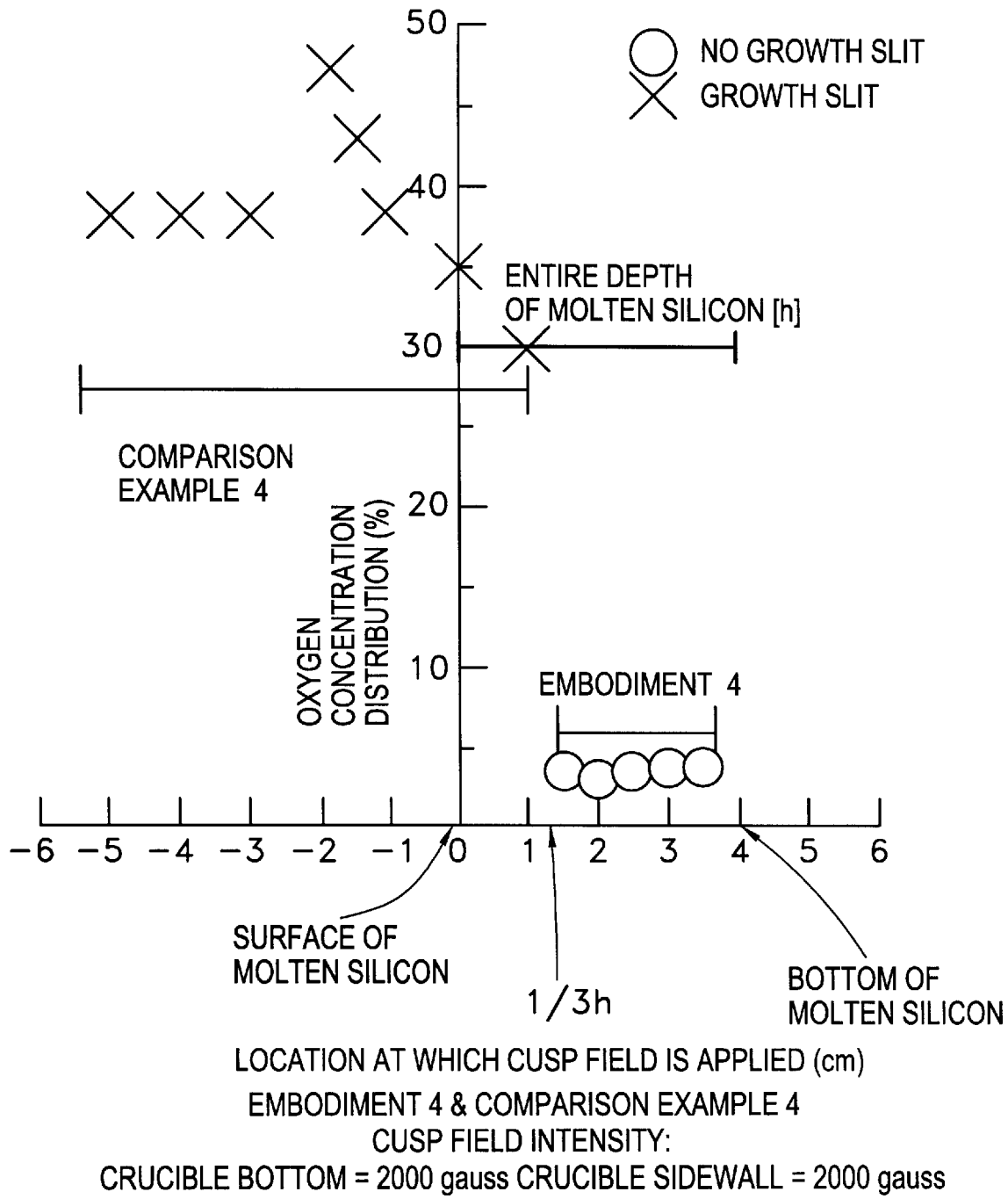
FIG. 9 is a graph illustrating results of carrying out methods in accordance with the embodiment 4 and comparison example 4.

FIG. 6 is a graph showing the experimental results of the embodiment 1 and the comparison example 1, FIG. 7 is a graph showing the experimental results of the embodiment 2 and the comparison example 2, FIG. 8 is a graph showing the experimental results of the embodiment 3 and the comparison example 3, and FIG. 9 is a graph showing the experimental results of the embodiment 4 and the comparison example 4.

An x-axis in each of the graphs illustrated in FIGS. 6 to 9 indicates a location at which cusp field is applied to molten silicon, and a y-axis indicates distribution of oxygen concentration in crystal in a diametric diameter. The distribution of oxygen concentration is defined with the following equation.

$$(A-B) \times 100/A$$

In the equation, A indicates oxygen concentration at a center of crystal, and B indicates oxygen concentration at an edge of crystal.

In accordance with the inventive method wherein a center of cusp field is arranged to be located at one-third or greater of an entire depth of molten silicon, it is possible to prevent generation of growth slits in silicon monocrystal, and reduce a difference in oxygen concentration in a radial direction between a center of crystal and an edge of crystal down to 5% or smaller, namely, uniformize oxygen concentration distribution.

In addition, in accordance with the inventive method, a relative positional relation between a center of cusp field and a surface of molten silicon is kept unchanged. As a result, it is possible to prevent generation of growth slits in all regions in a growth direction in silicon monocrystal, and reduce a difference in oxygen concentration in a diametric direction down to 5% or smaller, namely, uniformize oxygen concentration distribution.

Table 5 shows conditions for growing silicon monocrystal in the embodiments 5 to 7.

Silicon monocrystal having diameters of 20 cm, 30 cm, and 40 cm were grown in the embodiments 5, 6, and 7, respectively.

In each of the embodiments 5 to 7, there was employed a quartz crucible having a diameter of 2.5 times greater than a diameter of the crystal. The magnetic field having been applied to molten silicon had 1000 gauss component perpendicularly to a bottom of a crucible, and 1000 gauss component perpendicularly to a sidewall of a crucible. The conditions for growing silicon monocrystal are shown in Table 5.

The crystal having been obtained in the embodiments 5 to 7 were observed as to whether growth slits were found, and measured oxygen concentration in a diametric diameter, similarly to the above-mentioned embodiments 1 to 4.

TABLE 5

| | N | A | B | C | D | E | F | G | H |
|---|---|---|---|---|---|---|---|---|---|
| Embodiment 5 | 20 | 1000 | 1000 | 0 to 20 | 0.1 to 10 | 20.0 | 6.66 | 7.0, 8.0, 9.0, 10.0, 15.0 | Yes |
| Embodiment 6 | 30 | 1000 | 1000 | 0 to 20 | 0.1 to 10 | 30.0 | 10.0 | 10.0, 12.0, 15.0, 20.0, 25.0 | Yes |
| Embodiment 7 | 40 | 1000 | 1000 | 0 to 20 | 0.1 to 10 | 40.0 | 13.33 | 14.0, 18.0, 25.0, 30.0, 35.0 | Yes |

In Table 5, N and A to H mean as follows.

N: a diameter of crystal [cm]
A: an intensity of magnetic field at a bottom of a crucible [gauss]
B: an intensity of magnetic field at a sidewall of a crucible [gauss]
C: revolution per minute of silicon monocrystal [rpm]
D: revolution per minute of a crucible [gauss]
E: an entire depth of molten silicon H [cm]
F: H/3 [cm]
G: a depth of a center of cusp field from a surface of molten silicon at the time when silicon monocrystal starts being grown [cm]
H: whether a location at which cusp field is applied to is controlled The same measurements were conducted in comparison examples 9 to 11 in comparison with the above-mentioned embodiments 5 to 7. The conditions for growing silicon monocrystal in the comparison examples 9 to 11 are shown in Table 6.

TABLE 6

| | N | A | B | C | D | E | F | G | H |
|---|---|---|---|---|---|---|---|---|---|
| Comparison Example 9 | 20 | 1000 | 1000 | 0 to 20 | 0.1 to 10 | 20.0 | 6.66 | 5.0, 0.0, -5.0, -7.5, -8.0, -9.0, -10.0, -20.0 | No |
| Comparison Example 10 | 30 | 1000 | 1000 | 0 to 20 | 0.1 to 10 | 30.0 | 10.0 | 5.0, 0.0, -5.0, -10.0, -15.0, -20.0, -25.0, -30.0 | No |
| Comparison Example 11 | 40 | 1000 | 1000 | 0 to 20 | 0.1 to 10 | 40.0 | 13.33 | 10.0, 5.0, 0.0, -5.0, -10.0, -15.0, -20.0, -25.0, -30.0, -40.0 | No |

In Table 5, N and A to H mean as follows.

Figure 10:
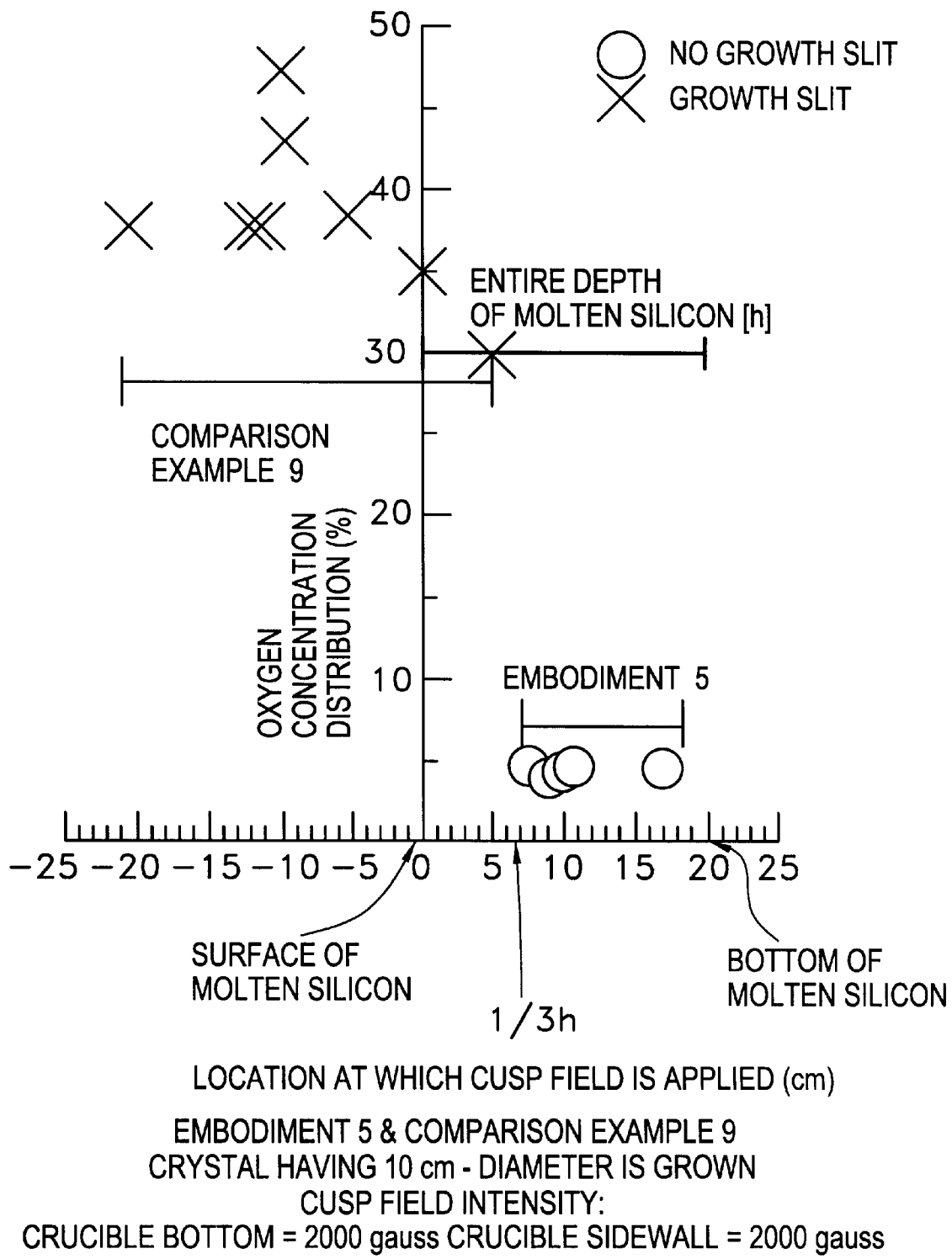
FIG. 10 is a graph illustrating results of carrying out methods in accordance with the embodiment 5 and comparison example 9.
Figure 11:
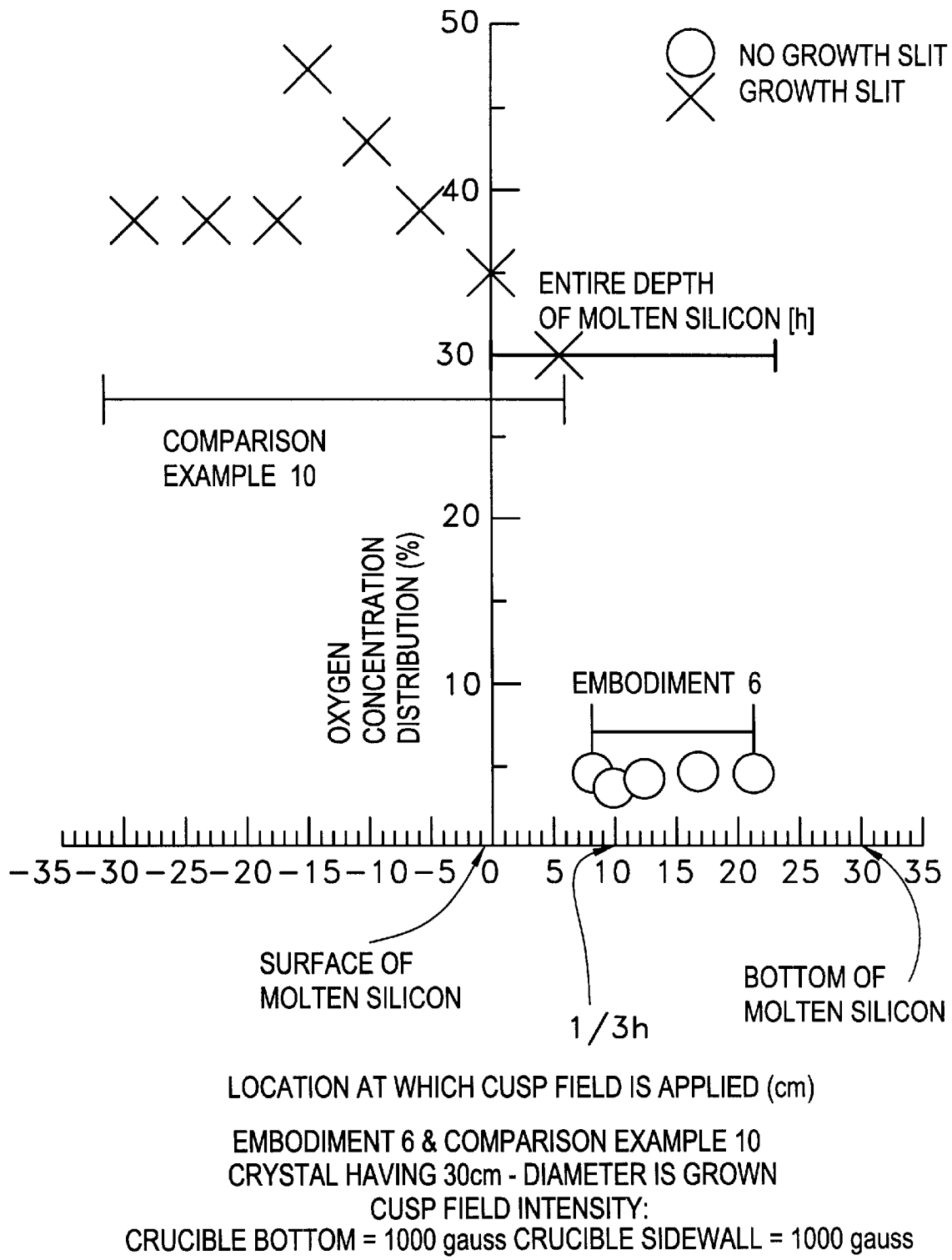
FIG. 11 is a graph illustrating results of carrying out methods in accordance with the embodiment 6 and comparison example 10.
Figure 12:
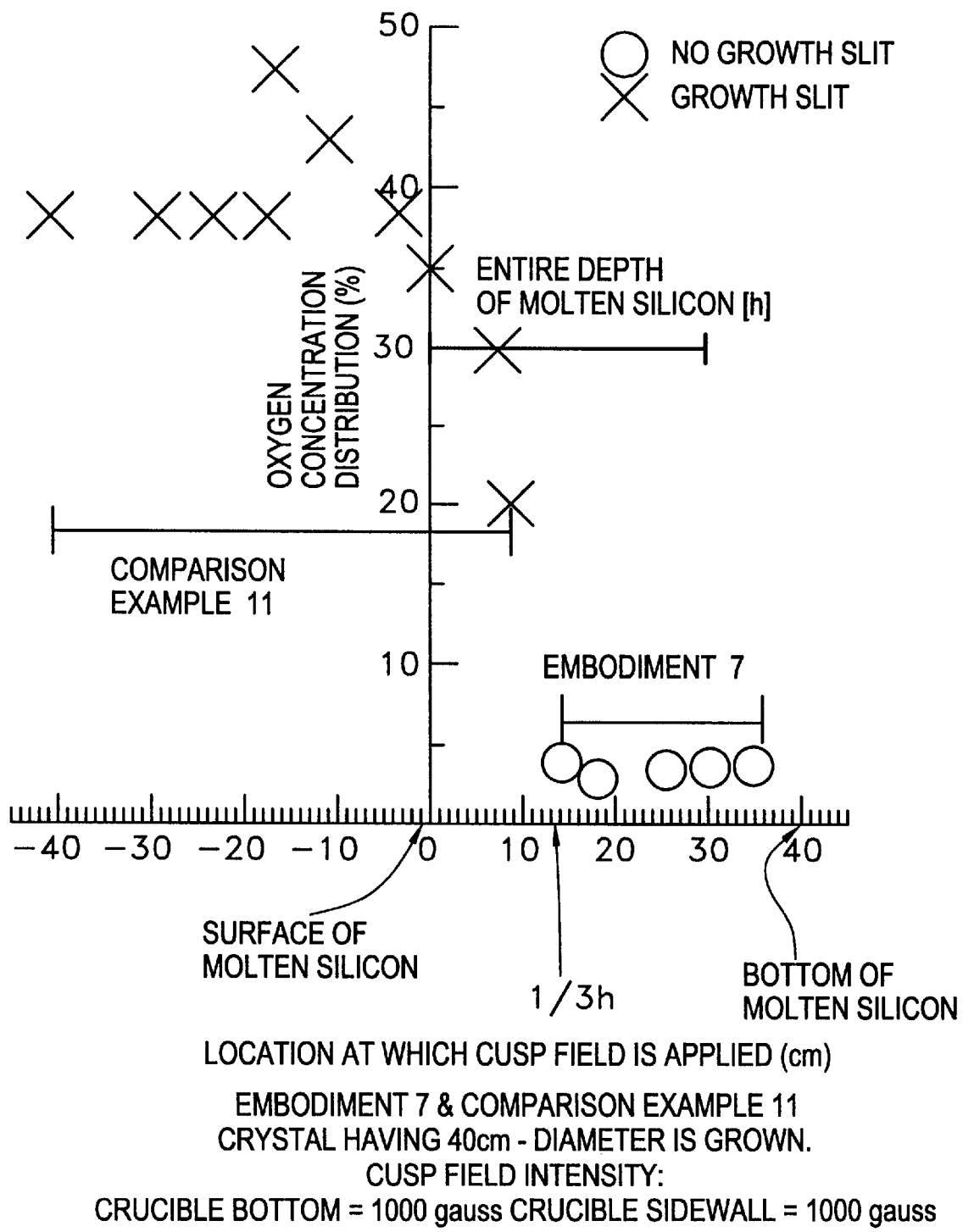
FIG. 12 is a graph illustrating results of carrying out methods in accordance with the embodiment 7 and comparison example 11.

N: a diameter of crystal [cm]
A: an intensity of magnetic field at a bottom of a crucible [gauss]
B: an intensity of magnetic field at a sidewall of a crucible [gauss]
C: revolution per minute of silicon monocrystal [rpm]
D: revolution per minute of a crucible [gauss]
E an entire depth of molten silicon H [cm]
F: H/3 [cm]
G: a depth of a center of cusp field from a surface of molten silicon at the time when silicon monocrystal starts being grown [cm]. A minus sign (−) indicates that a center of cusp field is applied above a surface of molten silicon.
H: whether a location at which cusp field is applied to is controlled In the comparison examples 9 to 11, crystal having the same diameters as the diameters of the crystal in the embodiments 5 to 7 were grown under the same conditions as those of the embodiments 5 to 7 except that cusp field was applied to molten silicon so that a center of cusp field was located at a depth smaller than one-third of an entire depth of the molten silicon. The measurement results of growth slits and oxygen concentration in grown crystal in the comparison examples 9 to 11 were also illustrated in FIGS. 10 to 12 as well as the results of the embodiments 5 to 7. Namely, FIG. 10 is a graph showing the experimental results of the embodiment 5 and the comparison example 9, FIG. 11 is a graph showing the experimental results of the embodiment 6 and the comparison example 10, and FIG. 12 is a graph showing the experimental results of the embodiment 7 and the comparison example 11.

In view of the experimental results of the embodiments 5 to 7 and the comparison examples 9 to 11, it is understood that the method in accordance with the present invention makes it possible to prevent generation of growth slits in grown silicon monocrystal without particularly defining revolutions per minute of crystal and a crucible, in a method of growing silicon monocrystal by Czochralski method with cusp field being applied to molten silicon.

The method in accordance with the present invention makes it possible to accomplish uniform oxygen concentration profile where a difference in an oxygen concentration in a diametric direction of crystal is equal to or smaller than 5%.

Furthermore, the method makes it possible to prevent generation of growth slits in all regions in a growth direction in a large-diameter silicon monocrystal, for instance, having a 40 cm-diameter.

Figure 13:
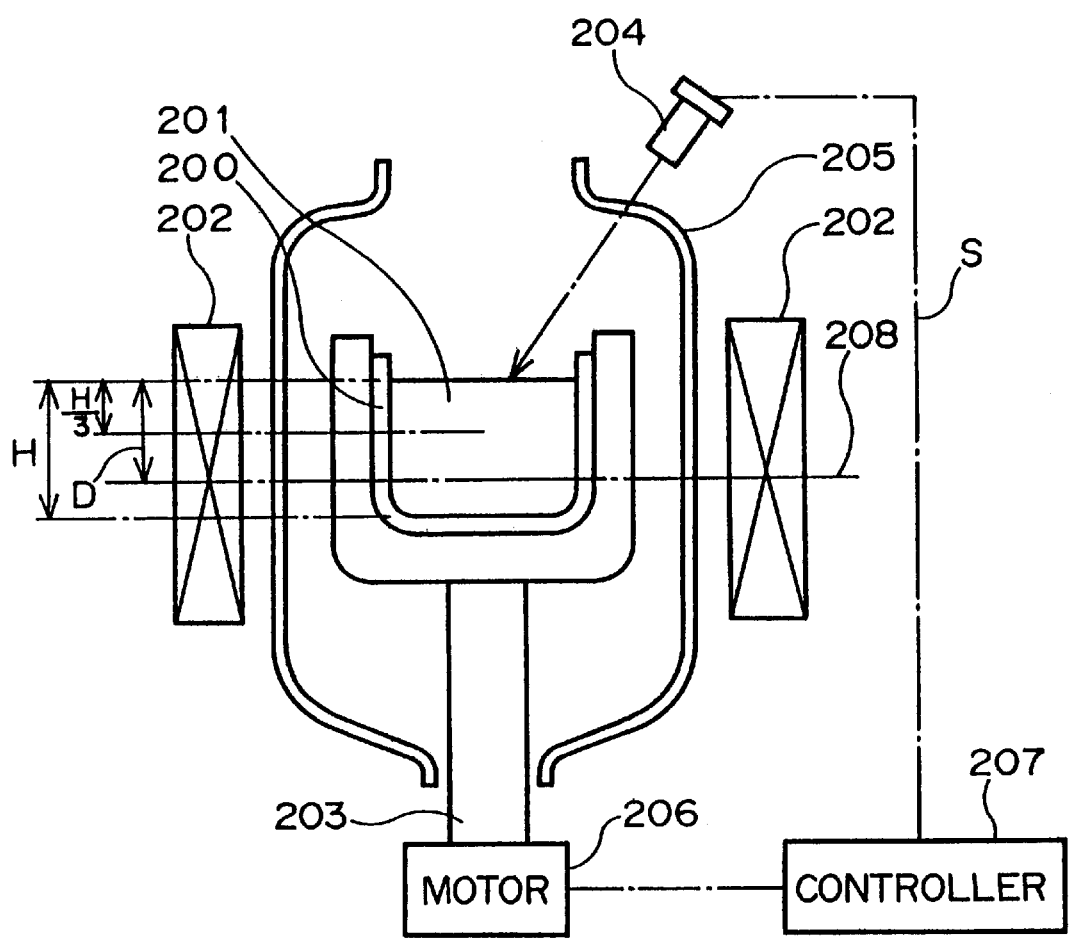
FIG. 13 is a side view of an apparatus of growing silicon monocrystal in accordance with an embodiment of the present invention.

FIG. 13 illustrates an apparatus for growing silicon monocrystal by Czochralski method, in accordance with a preferred embodiment of the present invention.

The illustrated apparatus includes a crucible 200 in which molten silicon 201 is contained, a pair of coils 202 for applying cusp field to the molten silicon 201, an elevator 203 for lowering or raising the crucible 200, a detector 204 for detecting a surface level of the molten silicon 201, an enclosure 205 for enclosing the crucible 200 and the molten silicon 201 contained in the crucible 200, a motor 206 for raising or lowering the elevator 203, and a controller 207 for controlling the motor 206 to thereby raise or lower the crucible 200.

In operation, the detector 204 such as an X-ray fluoroscopic device detects a surface level of the molten silicon 201, and transmits a signal S indicative of the thus detected surface level of the molten silicon 201, to the controller 207. Then, the controller 207 controls the motor 206 in accordance with the received signal S so that a center line 208 of cusp field is situated at a depth D of one-third or greater of an entire depth H of the molten silicon 201.

The apparatus illustrated in FIG. 13 provides the same advantages obtained by the above-mentioned method.

The controller 207 may be designed to control the motor 206 so that a ratio between the entire depth H of the molten silicon 201 and the depth D of the centerline 208 of cusp field is kept constant. For instance, the controller 207 may control the motor 206 and hence the elevator 203 so that the above-mentioned ratio is kept to be equal to any numeral which is greater than 1/3, for instance, 1/2.

Though the crucible 200 containing the molten silicon 201 therein is designed to be raised or lowered in the above-mentioned embodiment, the coils 202 may be designed to be lowered or raised in place of the crucible 200 so that the center line 208 of cusp field is situated at a depth D which is equal to or greater than one-third of the entire depth H of the molten silicon 201.

As an alternative, both the crucible 200 and the coils 202 may be lowered or raised.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-304208 filed on Nov. 6, 1997 including specification, claims, drawings and summary is incorporated herein by reference in its entirety.

What is claimed is:

1. A method of growing silicon monocrystal by Czochralski method where cusp field is applied to molten silicon, comprising the step of applying cusp field to molten silicon so that a center of said cusp field is situated at a depth of one-third or greater of an entire depth of said molten silicon, said depth being defined as a distance from a surface level of said molten silicon.

2. The method as set forth in claim 1, further comprising the step of drawing said molten silicon up so that a ratio between said entire depth of said molten silicon and said depth of said center of said cusp field is kept constant.

3. The method as set forth in claim 2, wherein said step of drawing said molten silicon up includes the steps of:

(a) detecting a surface level of said molten silicon; and (b) keeping said ratio constant during growth of said silicon monocrystal.

4. The method as set forth in claim 3, wherein said surface level of said molten silicon is detected by An X-ray fluoroscopy in said step (a).

5. The method as set forth in claim 3, wherein a crucible in which said molten silicon is contained is vertically moved to thereby keep said ratio constant in said step (b).

6. The method as set forth in claim 4, wherein a crucible in which said molten silicon is contained is vertically moved to thereby keep said ratio constant in said step (b).

7. The method as set forth in claim 3, wherein said center of said cusp field is vertically moved to thereby keep said ratio constant in said step (b).

8. The method as set forth in claim 4, wherein said center of said cusp field is vertically moved to thereby keep said ratio constant in said step (b).

* * * * *

UNITED STATES PATENT AND TRADEMARK OFFICE
CERTIFICATE OF CORRECTION

PATENT NO. : 6,048,779

DATED : April 11, 2000

INVENTOR(S) : Masahito WATANABE; Minoru EGUCHI

It is certified that error appears in the above-identified patent and that said Letters Patent is hereby corrected as shown below:

Column 1, line 6 delete "invenetion" insert --invention--
Column 8, line 8 (table 4) delete " 2.0 x °° 5 10 15 * " insert --0 0 5 10 15--

Signed and Sealed this

Third Day of April, 2001

*Attest:*

NICHOLAS P. GODICI

*Attesting Officer*  *Acting Director of the United States Patent and Trademark Office*